United States Patent
Cha et al.

(10) Patent No.: US 9,608,163 B2
(45) Date of Patent: Mar. 28, 2017

(54) NANO-STRUCTURE SEMICONDUCTOR LIGHT EMITTING DEVICE

(71) Applicant: SAMSUNG ELECTRONICS CO., LTD., Suwon-si, Gyeonggi-do (KR)

(72) Inventors: Nam Goo Cha, Ansan-si (KR); Bong Jin Kuh, Suwon-si (KR); Han Mei Choi, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 131 days.

(21) Appl. No.: 14/165,082

(22) Filed: Jan. 27, 2014

(65) Prior Publication Data

US 2014/0209858 A1    Jul. 31, 2014

(30) Foreign Application Priority Data

Jan. 29, 2013  (KR) .................. 10-2013-0010111

(51) Int. Cl.
*H01L 33/24* (2010.01)
*H01L 33/08* (2010.01)
(Continued)

(52) U.S. Cl.
CPC ............ *H01L 33/24* (2013.01); *H01L 33/005* (2013.01); *H01L 33/08* (2013.01); *H01L 33/18* (2013.01); *H01L 33/20* (2013.01); *B82Y 20/00* (2013.01)

(58) Field of Classification Search
None
See application file for complete search history.

(56) References Cited

U.S. PATENT DOCUMENTS 7,427,772 B2    9/2008  Chuo et al.
7,588,955 B2    9/2009  Huang et al.
(Continued)

FOREIGN PATENT DOCUMENTS

JP   2009027128 A    2/2009
JP   2012235122 A    11/2012
(Continued)

OTHER PUBLICATIONS http://www.thesaurus.com/browse/surround?s=t; 2016.*
(Continued)

*Primary Examiner* — Yu Chen
*Assistant Examiner* — Nilufa Rahim
(74) *Attorney, Agent, or Firm* — F. Chau & Associates, LLC

(57) ABSTRACT

A nano-structure semiconductor light emitting device includes a base layer formed of a first conductivity type semiconductor, and a first insulating layer disposed on the base layer and having a plurality of first openings exposing partial regions of the base layer. A plurality of nanocores is disposed in the exposed regions of the base layer and formed of the first conductivity-type semiconductor. An active layer is disposed on surfaces of the plurality of nanocores and positioned above the first insulating layer. A second insulating layer is disposed on the first insulating layer and has a plurality of second openings surrounding the plurality of nanocores and the active layer disposed on the surfaces of the plurality of nanocores. A second conductivity-type semiconductor layer is disposed on the surface of the active layer positioned to be above the second insulating layer.

7 Claims, 11 Drawing Sheets

(51) Int. Cl.
*H01L 33/00* (2010.01)
*H01L 33/18* (2010.01)
*H01L 33/20* (2010.01)
*B82Y 20/00* (2011.01)

(56) References Cited

U.S. PATENT DOCUMENTS

| | | | |
|---|---|---|---|
| 7,763,881 B2 | 7/2010 | Lee et al. | |
| 7,888,694 B2 | 2/2011 | Lee et al. | |
| 2004/0048409 A1 | 3/2004 | Biwa et al. | |
| 2004/0051110 A1 | 3/2004 | Oohata | |
| 2005/0145865 A1 | 7/2005 | Okuyama et al. | |
| 2007/0235738 A1 | 10/2007 | Jin et al. | |
| 2008/0149944 A1* | 6/2008 | Samuelson | B82Y 10/00 257/88 |
| 2009/0020772 A1 | 1/2009 | Chiu et al. | |
| 2010/0078688 A1* | 4/2010 | Otake | H01L 29/66666 257/288 |
| 2010/0276664 A1 | 11/2010 | Hersee | |
| 2011/0095314 A1 | 4/2011 | Pan et al. | |
| 2011/0114915 A1 | 5/2011 | Lee et al. | |
| 2011/0126891 A1 | 6/2011 | Goto et al. | |
| 2011/0140072 A1 | 6/2011 | Varangis et al. | |
| 2011/0272014 A1* | 11/2011 | Mathai | H01L 31/03528 136/255 |
| 2012/0001153 A1* | 1/2012 | Hersee | B82Y 20/00 257/22 |
| 2012/0153252 A1* | 6/2012 | Kim | H01L 33/24 257/13 |
| 2012/0205692 A1 | 8/2012 | Tan et al. | |
| 2012/0273755 A1 | 11/2012 | Wei et al. | |
| 2012/0315760 A1* | 12/2012 | Yu | H01L 21/82380 438/682 |
| 2013/0099199 A1 | 4/2013 | Cha et al. | |
| 2014/0209858 A1 | 7/2014 | Cha et al. | |

FOREIGN PATENT DOCUMENTS

| | | |
|---|---|---|
| KR | 10-2010-0133157 A | 12/2010 |
| KR | 10-2011-0054318 A | 5/2011 |
| KR | 10-2011-0058388 A | 6/2011 |
| KR | 10-1176885 B1 | 1/2012 |
| KR | 10-2012-0013076 A | 2/2012 |
| KR | 10-2012-0040550 A | 4/2012 |
| KR | 10-2012-0052651 A | 5/2012 |
| KR | 10-2012-0055391 A | 5/2012 |
| KR | 10-2012-0058137 | 6/2012 |
| KR | 10-2013-0025716 A | 3/2013 |
| KR | 101258583 B1 | 5/2013 |

OTHER PUBLICATIONS http://www.merriam-webster.com/dictionary/above; 2016.*
International Search Report issued in International Application No. PCT/KR2014/000813 dated May 16, 2014.
Jin-Min Lee ; J. Kieeme; A Researching about Reducing Leakage Current of Polycrystalline Silicon Thin Film Transistors with Bird's Beak Structure; vol. 24, No. 2, pp. 112-115, Feb. 2011.
Seung-Hyun Song, et al.; Simulation of nonoverlapped source/drain-to-gate Nano-CMOS for low leakage current ; IEEK , The Summer Conference, vol. 29, No. 1, pp. 579-580, 2006.
Office Action for U.S. Appl. No. 14/764,513 Dated Feb. 11, 2016.
Office Action for U.S. Appl. No. 14/764,513 Dated Aug. 26, 2016.

* cited by examiner

NANO-STRUCTURE SEMICONDUCTOR LIGHT EMITTING DEVICE

CROSS-REFERENCE TO RELATED APPLICATION

This application claims the benefit of priority to Korean Patent Application No. 10-2013-0010111 filed on Jan. 29, 2013, in the Korean Intellectual Property Office, the disclosure of which is incorporated herein by reference in its entirety.

TECHNICAL FIELD

The present disclosure relates to a nano-structure semiconductor light emitting device.

BACKGROUND

A light emitting diode (LED) is a semiconductor light emitting device in which materials included therein emit light. In an LED, energy generated according to electron-hole recombination is converted into light to be emitted therefrom. LEDs are commonly used as a light source in lighting devices and display devices, and as such, the development thereof has accelerated.

Recently, in order to increase luminance efficiency by enhancing crystallinity and increasing a light emitting area, semiconductor light emitting devices using nano-structures and manufacturing techniques thereof have been developed. Semiconductor light emitting devices using nano-structures generate a relatively small amount of heat, and since an increased surface area of nano-structures is used, a light emitting area is increased to enhance luminous efficiency.

Also, an active layer can be obtained from a non-polar plane or an anti-polar plane, a degradation of efficiency due to polarization can be prevented and droop characteristics can be improved.

In case of a nano-structure semiconductor light emitting device, a light emitting structure is formed as a fine structure on the nano-scale, layers are formed to be very thin and delamination, or the like, may occur in an interface between a layer and a mask as an insulating layer. Thus, a leakage current may be generated when a device is driven.

SUMMARY

An aspect of the present disclosure provides a nano-structure semiconductor light emitting device having a novel structure capable of reducing a leakage current.

According to an aspect of the present disclosure, there is provided a nano-structure semiconductor light emitting device including a base layer formed of a first conductivity type semiconductor and a first insulating layer disposed on the base layer and having a plurality of first openings exposing partial regions of the base layer. A plurality of nanocores is disposed in the exposed regions of the base layer and formed of the first conductivity-type semiconductor. An active layer is disposed on surfaces of the plurality of nanocores and positioned above the first insulating layer. A second insulating layer is disposed on the first insulating layer and has a plurality of second openings surrounding the plurality of nanocores and the active layer disposed on the surfaces of the plurality of nanocores. A second conductivity-type semiconductor layer is disposed on the surface of the active layer positioned above the second insulating layer.

The active layer may be disposed on inner side walls of the second openings.

The second openings may have a diameter greater than that of the first openings, and a portion of the first insulating layer in the perimeter of the first openings may be exposed by the second openings.

Regions of the nanocores positioned in the second openings may have a sectional area greater than upper and lower regions thereof.

The inner side walls of the second openings may have an upwardly sloped surface, and an end of the active layer may be positioned on the sloped surface.

The first and second insulating layers may be made of the same material. The first and second insulating layers may have different etching rates under the same etching conditions. An etching rate of the second insulating layer may be higher than that of the first insulating layer. In order to induce the difference in etching rates, the first and second insulating layers may be made of different materials or may have different air gap densities.

The second insulating layer may be made of a material obtained by oxidizing a material of the first insulating layer.

According to another aspect of the present disclosure, there is provided a nano-structure semiconductor light emitting device including a base layer formed of a first conductivity-type semiconductor, and a first insulating layer disposed on the base layer and having a plurality of first openings exposing partial regions of the base layer. A plurality of nanocores is disposed in the exposed regions of the base layer and formed of the first conductivity-type semiconductor. An active layer and a second conductivity-type semiconductor layer are sequentially disposed on surfaces of the plurality of nanocores, and are positioned above the first insulating layer. A second insulating layer is disposed on the first insulating layer and has a plurality of second openings surrounding the plurality of nanocores, the active layer, and the second conductivity-type semiconductor layer sequentially disposed on the surfaces of the plurality of nanocores. An electrode is positioned above the second insulating layer and is connected to the second conductivity-type semiconductor layer.

The first and second insulating layers may have different etching rates under the same etching conditions. An etching rate of the second insulating layer may be higher than that of the first insulating layer. In order to induce the difference in etching rates, the first and second insulating layers may be made of different materials or may have different air gap densities.

The second insulating layer may be made of a material obtained by oxidizing a material of the first insulating layer.

According to another aspect of the present disclosure, there is provided a nano-structure semiconductor light emitting device comprising a base layer formed of a first conductivity type semiconductor and an insulating layer disposed on the base layer and having a plurality of first openings exposing partial regions of the base layer. A plurality of nanocores formed of the first conductivity-type semiconductor is disposed in the exposed regions of the base layer. Outer surfaces of the nanocores are stable crystal planes. An active layer is disposed on the surfaces of the plurality of nanocores and positioned above the insulating layer. A second conductivity-type semiconductor layer is disposed on a surface of the active layer and positioned above the insulating layer.

The stable crystal planes may be anti-polar or non-polar planes, and the nanocores may be hexagonal pillar-shaped._

The base layer may comprise a nitride semiconductor satisfying $Al_xIn_yGa_{1-x-y}N$ (0≤x≤1, 0≤y≤1, 0≤x+y≤1).

The nano-structure semiconductor light emitting device may further comprise a contact electrode filling spaces between adjacent nanocores.

BRIEF DESCRIPTION OF THE DRAWINGS

The above and other aspects, features and other advantages of the present disclosure will be more clearly understood from the following detailed description taken in conjunction with the accompanying drawings.

DETAILED DESCRIPTION

Figure 1:
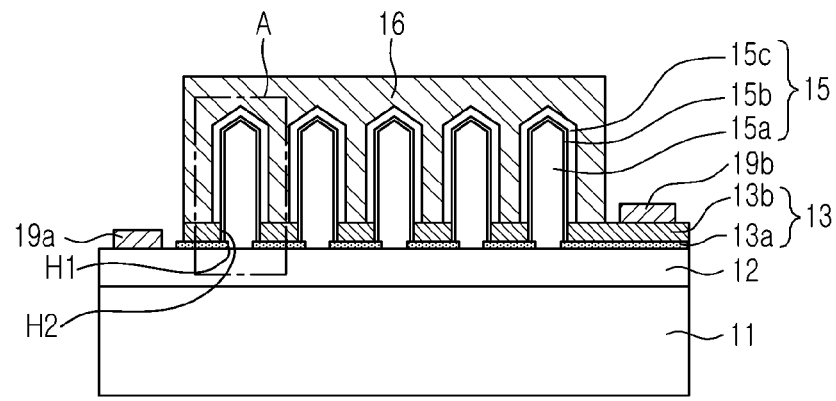
FIG. 1 is a cross-sectional view of a nano-structure semiconductor light emitting device according to an embodiment of the present disclosure.

Embodiments of the present disclosure will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like components.

FIG. 1 is a cross-sectional view of a nano-structure semiconductor light emitting device according to an embodiment of the present disclosure.

As illustrated in FIG. 1, a nano-structure semiconductor light emitting device 10 according to the present embodiment includes a base layer 12 formed of a first conductivity-type semiconductor and a plurality of nano-light emitting structures 15 formed on an upper surface thereof.

The plurality of nano-light emitting structures 15 include a nanocore 15a formed of the first conductivity-type semiconductor and an active layer 15b and a second conductivity-type semiconductor layer 15c sequentially formed on a surface of the nanocore 15a, respectively.

A contact electrode 16 is formed on the nano-light emitting structure 15 and connected to the second conductivity-type semiconductor layer 15c. The nano-structure semiconductor light emitting device 10 includes first and second electrodes 19a, 19b connected to the base layer 12 and the contact electrode 16, respectively.

The base layer 12 is formed on a substrate 11 to provide a growth surface for the nano-light emitting structure 15, and serves to electrically connect common polarities of the plurality of nano-light emitting structures 15 on one side thereof.

The substrate 11 may be an insulating, conductive, or semiconductor substrate. For example, the substrate 11 may be made of sapphire, SiC, Si, $MgAl_2O_4$, MgO, $LiAlO_2$, $LiGaO_2$, or GaN. The base layer 12 may be a nitride semiconductor satisfying an empirical formula $Al_xIn_yGa_{1-x-y}N$ (0≤x≤1, 0≤y≤1, 0≤x+y≤1) and may be doped with n-type impurity such as silicon (Si) to have a particular conductivity type.

Figure 2:
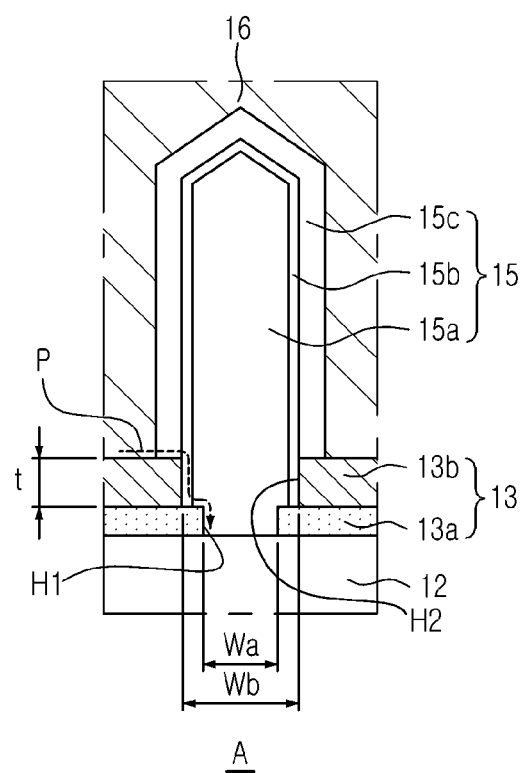
FIG. 2 is a cross-sectional view showing an enlarged portion 'A' in a nano-light emitting structure of the light emitting device illustrated in FIG. 1.

FIG. 2 is a cross-sectional view showing an enlarged portion 'A' in the nano-light emitting structure 15 of the light emitting device illustrated in FIG. 1. A first insulating layer 13a may be formed on the base layer 12. The first insulating layer 13a may have a plurality of first openings H1 through which partial regions of the base layer 12 are exposed. A second insulating layer 13b is formed on the first insulating layer 13a. The second insulating layer 13b includes second openings H2 arranged in positions corresponding to the first openings H1. In this manner, the first and second insulating layers 13a and 13b may be provided as a single mask. The first and second insulating layers 13 may be provided as a single mask. As the first and second insulating layers 13, an insulator that may be used in a semiconductor process may be used. For example, the insulator may be an insulating material such as $SiO_2$ or $SiN_x$.

The exposed region of the base layer 12 is provided by the first opening H1, and the plurality of nanocores 15a formed of the first conductivity-type semiconductor are formed in the exposed region. The active layer 15b and the second conductivity-type semiconductor layer 15c are sequentially formed as shells on the surface of the nanocore 15a.

In the present embodiment, the nanocore 15a is disposed, starting from the surface of the base layer 12, but the active layer 15b is disposed above the first insulating layer 13a. The second insulating layer 13b surrounds the active layer 15b formed on the surface of the plurality of nanocores 15a, and the second opening H2 of the second insulating layer 13b may be formed along the outer circumference of the active layer 15b. Also, the second conductivity-type semiconductor layer 15c is disposed above the second insulating layer 13b.

A formation position of the shells and a change in a leakage current path will be described in detail with reference to FIG. 2. As illustrated in FIG. 2, a width Wb of the second opening H2 is larger than a width Wa of the first opening H1, and a portion of the first insulating layer 13a may be exposed along the circumference of the first opening H1 by the second opening H2. In this structure, the active layer 15b is grown on the surface of the nanocore 15a above the exposed portion of the first insulating layer 13a, and in this case, as illustrated in FIG. 2, the active layer 15b may be formed with an end disposed on the surface of first insulating layer 13a. Similarly, the second conductivity-type semiconductor layer 15c may also be formed with an end disposed on a surface of the second insulating layer 13b.

In general, a shell structure is provided as a double-layer structure including the active layer 15b and the second conductivity-type semiconductor layer 15c, but in the present embodiment, the active layer 15b may be formed as a single layer on the surface of the nanocore 15a, without the second conductivity-type semiconductor layer 15c. Namely, since the active layer 15b is formed on inner side walls of the second opening H2, a length of the extended portion of the active layer 15b may correspond to thickness t of the second insulating layer 13b.

As for a leakage current path P formed from the second conductivity-type semiconductor layer 15c to the first conductivity-type nanocore 15a, the leakage current path P may be formed along a surface of the mask 13 and may be increased as long as the extended portion of the active layer 15b. Namely, in the present embodiment, the leakage current path equaling the thickness t of the second insulating layer 13b is lengthened to drastically reduce a possibility of generating a leakage current.

The active layer 15b may have a multi-quantum well (MQW) structure in which a quantum well layer and a quantum barrier layer are alternately laminated. For example, in the case of a nitride semiconductor, a GaN/InGaN structure may be used, or a single quantum well (SQW) structure may also be used, as necessary. The second conductivity-type semiconductor layer 15c may be a crystal satisfying p-type $Al_xIn_yGa_{1-x-y}N$. The second conductivity-type semiconductor layer 15c may further include an electron blocking layer (not shown) in a region adjacent to the active layer 15b. The electron blocking layer (not shown) may have a structure in which a plurality of n-type $In_xAl_yGa_{(1-x-y)}N$ layers having different compositions are laminated or may have one or more layers including $Al_yGa_{(1-y)}N$. The electron blocking layer has a bandgap wider than that of the active layer 15b, thus preventing electrons from being transferred to the second conductivity-type (p-type) semiconductor layer 15c.

The contact electrode 16 may be obtained by forming a seed layer (not shown) on the surface of the nano-light emitting structures 15 and subsequently performing electroplating thereon. The seed layer (not shown) may be made of a material appropriate for actualizing ohmic-contact with the second conductivity-type semiconductor layer.

The ohmic-contact material may be used to form a GaN layer, a InGaN layer, a ZnO layer, or a graphene layer. The ohmic-contact material may include silver (Ag), nickel (Ni), aluminum (Al), rhodium (Rh), palladium (Pd), iridium (Ir), ruthenium (Ru), magnesium (Mg), zinc (Zn), platinum (Pt), gold (Au), or the like, and the contact electrode 16 may have a structure including two or more layers such as Ni/Ag, Zn/Ag, Ni/Al, Zn/Al, Pd/Ag, Pd/Al, Ir/Ag, Ir/Au, Pt/Ag, Pt/Al, Ni/Ag/Pt, or the like. For example, the contact electrode 16 may be formed by performing sputtering on an Ag/Ni/Cr layer as a seed layer and subsequently performing electroplating on Cu/Ni.

If necessary, after the contact electrode 16 is formed, a polishing process may be applied to make an upper surface of the contact electrode 16 smooth.

In the present embodiment, the contact electrode 16 may be employed as a reflective metal layer that allows light to be extracted in a direction toward the substrate. However, the present disclosure is not limited thereto and the contact electrode 16 may be made of a transparent electrode material such as indium tin oxide (ITO) that allows light to be extracted in a direction toward the nano-light emitting structures 15.

In the present embodiment, the contact electrode 16 fills spaces between the nano-light emitting structures 15, but without being limited thereto. The contact electrode may be formed as a thin layer on the surface of the nano-light emitting structures and a filler material having electrical insulating properties may fill the spaces between the nano-light emitting structures 15.

The novel nano-structure semiconductor light emitting device may be implemented by using various manufacturing methods. FIGS. 3A through 3D are cross-sectional views illustrating major processes of a method for manufacturing the nano-structure semiconductor light emitting device in FIG. 1.

Figure 3A:
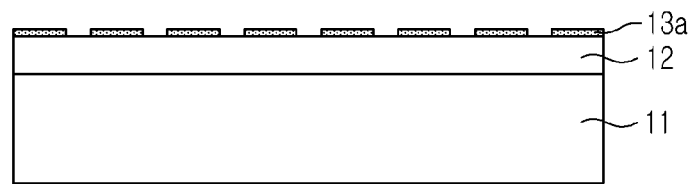
FIGS. 3A through 3D are cross-sectional views illustrating major processes of a method for manufacturing a nano-structure semiconductor light emitting device in FIG. 1.

As illustrated in FIG. 3A, the first insulating layer 13a formed of a first conductivity-type semiconductor is formed as a primary mask on the base layer 12. The base layer 12 formed on the substrate 11, provides a growth surface for growing the nano-light emitting structures, and serves to electrically connect common polarities of the nano-light emitting structures 15 on one side thereof. Thus, as discussed above, the base layer 12 is formed as a semiconductor single crystal having electrical conductivity. When the base layer 12 is directly grown, the substrate 11 may be a substrate for crystal growth. The base layer 12 may be a nitride semiconductor satisfying $Al_xIn_yGa_{1-x-y}N$ ($0 \le x \le 1$, $0 \le y \le 1$, $0 \le x+y \le 1$), and may be doped with n-type impurity such as silicon (Si). In this case, the substrate 21 may be made of sapphire, SiC, Si, $MgAl_2O_4$, MgO, $LiAlO_2$, $LiGaO_2$, or GaN.

The first insulating layer 13a may have a plurality of first openings H1 exposing a region of the base layer 12. After an insulating material is deposited on the base layer 12 to form the first insulating layer 13a, a plurality of first openings H1 are formed to expose the base layer 22 region. The first insulating layer 13a may be made of an insulating material such as $SiO_2$ or SiN. A size of the first opening H1 may be designed in consideration of a size of a desired nano-light emitting structure (in particular, a nanocore). For example, the first opening H1 may be formed to have a width equal to or smaller than 500 nm, preferably, equal to 200 nm. A planar shape and arrangement of the first opening H1 may be variously implemented. For example, in case of a planar shape, the first opening H1 may have various shapes such as a polygonal shape, a quadrangular shape, an oval shape, and a circular shape.

Figure 3B:
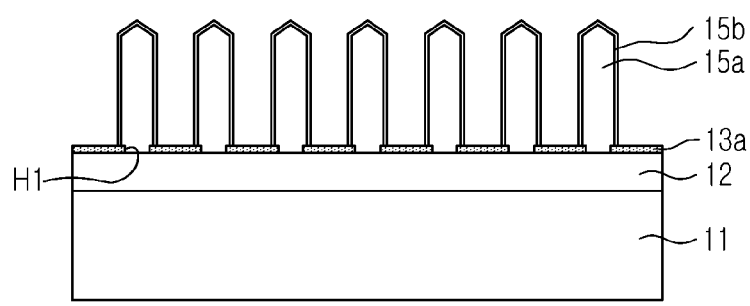

Thereafter, as illustrated in FIG. 3B, the nanocores 15a are grown on the base layer 12 exposed through the first openings H1 by using the first insulating layer 13a, and the active layer 15b is subsequently grown. During this process, a first conductivity-type semiconductor is selectively grown by using the first insulating layer 13a to form the nanocores 15a, and the active layer 15b is formed on the surface of the nanocores 15a on the first insulating layer 13a. The nanocores 15a are formed on the surface of the base layer 12, but the active layer 15b may be formed at a position above the first insulating layer 13a.

The first conductivity-type semiconductor of the nanocores 15a may be an n-type nitride semiconductor and may be a crystal satisfying n-type $Al_xIn_yGa_{1-x-y}N$ ($0 \leq x \leq 1$, $0 \leq y \leq 1$, $0 \leq x+y \leq 1$), for example. The first conductivity-type semiconductor constituting the nanocores 15a may be the same material as that of the first conductivity-type semiconductor of the base layer 12. For example, the base layer 12 and the nanocores 15a may be made of n-type GaN.

The nitride single crystal constituting the nanocores 15a may be formed by using metal-organic chemical vapor deposition (MOCVD) or molecular beam epitaxy (MBE). Here, since crystals are grown in the base layer 12 regions exposed through the first openings H1, rather than on the first insulating layer 13a, desired nanocores 15a may be provided. In the present embodiment, the nanocores 15a have a rod structure, but the present disclosure is not limited thereto and the nanocores 15a may have a polypyramid shape such as a hexagonal pyramid, for example. This may be implemented by regulating growth conditions (a growth temperature, growth pressure, and a flow rate of a source).

The active layer 15b may have a multi-quantum well (MQW) structure in which a quantum well layer and a quantum barrier layer are alternately laminated. For example, in the case of a nitride semiconductor, a GaN/InGaN structure may be used, or a single quantum well (SQW) structure may also be used, as necessary.

Figure 3C:
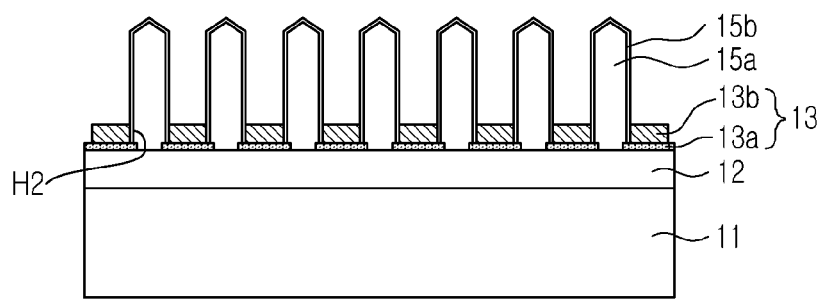

Thereafter, as illustrated in FIG. 3C, the second insulating layer 13b is formed as a secondary mask on the first insulating layer 13a. The second insulating layer 13b may be made of an insulating material such as $SiO_2$ or SiN. In the present embodiment, the second insulating layer 13b may be made of the same material as that of the first insulating layer 13b. The second opening H2 is provided after the active layer 15b is formed, so the second opening H2 may be formed to surround the active layer 15b. When expressed other way, the active layer 15b may be formed on inner side walls of the second opening H2 such that it corresponds to a thickness of the second insulating layer 13b.

The nanocore 15a may be grown in a lateral direction on the upper surface of the first insulating layer 13a, beyond the first opening H1, and since the active layer 15b is formed on the surface of the nanocore 15a, the second opening H2 may be greater than the first opening H1.

Figure 3D:
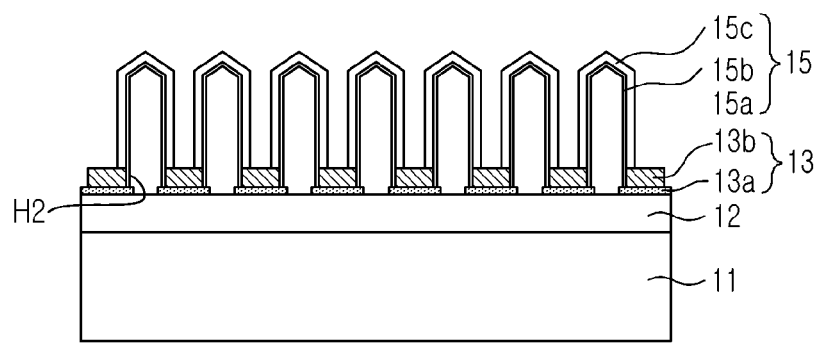

Subsequently, as illustrated in FIG. 3D, the second conductivity-type semiconductor layer 15c is grown on the surface of the active layer 15b by using the second insulating layer 13b.

Through this process, the nano-light emitting structure 15 may have a core-shell structure including the nanocore 15a formed of the first conductivity-type semiconductor and the shell layers including the active layer 15b and the second conductivity-type semiconductor layer 15c covering the nanocores 15a.

The second insulating layer 13b surrounds the active layer 15b formed on the surface of the plurality of nanocores 15a, and the second opening H2 of the second insulating layer 13b may be formed along the outer circumference of the active layer 15b. Also, the second conductivity-type semiconductor layer 15c is formed at a position above the second insulating layer 13b.

As a result, as described above with reference to FIG. 2, the active layer 15b may have a portion extending along the inner side wall of the second opening H2 in which the second conductivity-type semiconductor layer does not exist, and since a leakage current path is increased as long as the extended portion, a probability of generating a leakage current can be significantly reduced.

Figure 4:
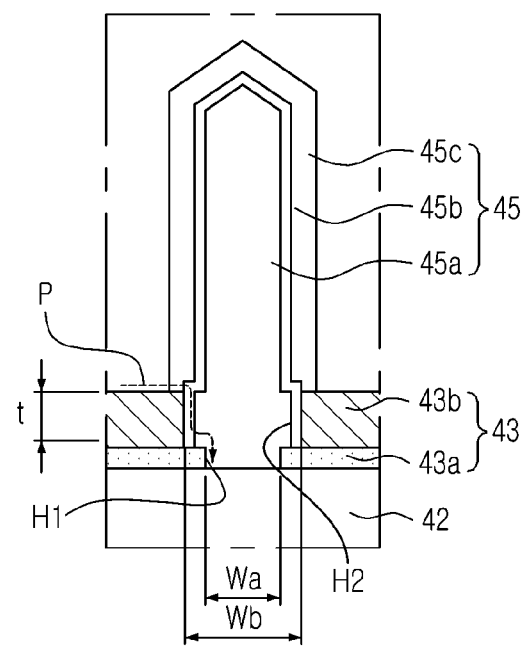
FIG. 4 is a cross-sectional view illustrating a nano-light emitting structure employed in a particular example according to a modification of the present disclosure.

Unlike the process described with reference to FIGS. 3A through 3D, the present disclosure may be similarly applied to a configuration in which a mask is used as a mold structure. In this case, a similar nano-light emitting structure may be implemented by configuring a mask as multiple insulating layers with selectively used materials having different etching rates. The nano-light emitting structure may be variously modified to be implemented by using the molding process. FIG. 4 is a cross-sectional view illustrating a nano-light emitting structure employed in a particular example according to a modification of the present disclosure.

A nano-light emitting structure 45 illustrated in FIG. 4 is formed on the base layer 42 formed of a first conductivity-type semiconductor, and includes a nanocore 45a formed of the first conductivity-type semiconductor and an active layer 45b and a second conductivity-type semiconductor layer 45c sequentially formed on the surface of the nanocore 45a.

The nano-light emitting structure 45 and the insulating layer structure illustrated in FIG. 4 may be understood as part of the nano-structure semiconductor light emitting device illustrated in FIG. 1. Description of the respective components with reference to FIG. 1 may be cited for reference as descriptions of the present embodiment unless otherwise specified.

Similar to the embodiment illustrated in FIG. 1, a first insulating layer 43a is formed on the base layer 42. The first insulating layer 43a has a plurality of first openings H1 exposing partial regions of the base layer 42. The second insulating layer 43b is formed on the first insulating layer 43a. The second insulating layer 43b has second openings H2 arranged in positions corresponding to the first openings H1. In this manner, the first and second insulating layers 43a and 43b may be provided as a single mask. The first and second insulating layers 43a and 43b may be formed of an insulator that may be used during a semiconductor process. For example, the insulator may be an insulating material such as $SiO_2$ or $SiN_x$.

As illustrated in FIG. 4, the width Wb of the second opening H2 is greater than the width Wa of the first opening H1, and a portion of the first insulating layer 43a may be exposed along the perimeter of the first opening H1 by the second opening H2.

The exposed regions of the base layer 42 are provided by the first openings H1, and a plurality of nanocores 45a formed of the first conductivity-type semiconductor are formed in the exposed regions. The nanocores 45a employed in the present embodiment may be configured such that a sectional area of a region thereof corresponding to the second insulating layer 42 is larger than those of upper and lower regions adjacent thereto.

An active layer 45b is formed on the surface of the nanocores 45a having convex portions. The nanocores 45a are formed on the surface of the base layer 42, but the active layer 45b is formed in a position above the first insulating layer 43a. The second insulating layer 43b surrounds the active layer 45b formed on the surface of the plurality of nanocores 45a, and the second opening H2 of the second insulating layer 43b may be formed along the outer circumference of the active layer 45b.

Also, the second conductivity-type semiconductor layer 45c is formed on the surface of the active layer 45b in a position above the second insulating layer 43b.

Due to the positions of the shells (the active layer and the second conductivity-type semiconductor layer), a leakage current path may be changed.

In detail, the active layer 45b is grown on the convex surface of the nanocore 45a above the exposed portion of the first insulating layer 43a, and as illustrated in FIG. 4, the active layer 45b may be formed such that an end thereof starts from the surface of the first insulating layer 43a. Similarly, the second conductivity-type semiconductor layer 45c may be formed such that an end thereof may start from the surface of the second insulating layer 43b.

In the present embodiment, the active layer 45b may be provided as a single layer without the second conductivity-type semiconductor layer 45c on the surface of the nanocore 45a in the second opening of the second insulating layer 43b, and since a leakage current path extends by using the convex surface of the nanocore, the leakage current path can be lengthened to be greater than the thickness t of the second insulating layer 43b, significantly reducing a probability of generating a leakage current.

The nano-light emitting structure may be easily implemented by using the multiple insulating layers having different etching rates as a mask in the method for manufacturing the nano-structure semiconductor light emitting device using the mask as a mold. FIGS. 5A through 5E are cross-sectional views illustrating major processes of a method for manufacturing a light emitting device employing the nano-light emitting structure in FIG. 4.

Figure 5A:
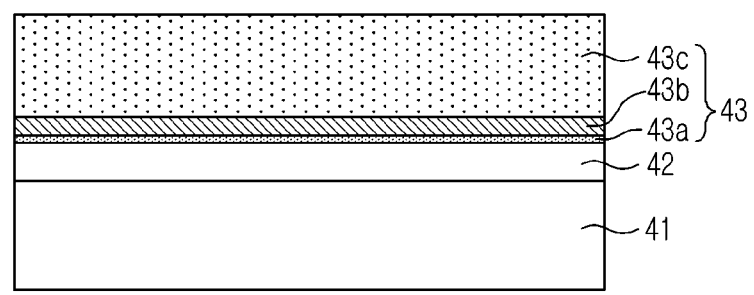
FIGS. 5A through 5E are cross-sectional views illustrating major processes of a method for manufacturing a light emitting device employing the nano-light emitting structure in FIG. 4.

As illustrated in FIG. 5A, the base layer 42 is provided on the substrate 41 and the mask 43 having a multi-layer structure is formed on the base layer 42.

The mask 43 employed in the present embodiment includes the first to third insulating layers 43a, 43b, and 43c sequentially formed on the base layer 42. The first and second insulating layers 43a and 43b are made of a material having electrical insulating properties, and if necessary, the third insulating layer 43c may also be made of an insulating material.

The first to third insulating layers 43a, 43b, and 43c employed in the present embodiment are selected to satisfy conditions that the second insulating layer 43b has an etching rate higher than those of the first and third insulating layers 43a and 43c during a first etching process and the first and second insulating layers 43a and 43b have an etching rate lower than that of the third insulating layer 43c. The first etching process may be a process of forming openings, during which overetching of the second insulating layer 43b is induced (FIG. 5B), and the second etching process may be a process during which the mold is partially removed such that the surface of the nano-light emitting structure is exposed (FIG. 5C).

The difference in etching rates may be implemented by using at different materials for the insulating layers or different density (air gap density) materials. For example, the first to third insulating layers 43a, 43b, 43c may be implemented as SiN (high density), SiN (low density), and $SiO_2$, respectively. Alternatively, the first to third insulating layers 43a, 43b, 43c may be implemented as SiN, $SiO_2$ (low density), and $SiO_2$ (high density), respectively. Here, high density may refer to a state in which there is a very small air gap, or a relatively low air gap density, and low density may refer to a relatively high air gap density.

A total thickness of the first to third insulating layers 43a, 43b, and 43c may be designed in consideration of a height of a desired nano-light emitting structure. The first and second insulating layers 43a and 43b may have a thickness smaller than that of the third insulating layer 43c. An etch stop level of the second insulating layer 43b may be as high as one-third of the overall height of the mask 43 from the surface of the base layer 42, i.e., a total thickness of the first to third insulating layers 43a, 43b, 43c.

The overall height of the mask 43, i.e., the total thickness of the first to third insulating layers 43a, 43b, 43c may be greater than 1 μm. In certain embodiments the total thickness may range from 5 μm to 10 μm. The first and second insulating layers 43a, 43b may be equal to or smaller than 0.5 μm. The second insulating layer 43b serves as a factor for determining an increased leakage current path, so it may be formed to have a thickness of at least 100 nm to achieve a sufficient effect.

Figure 5B:
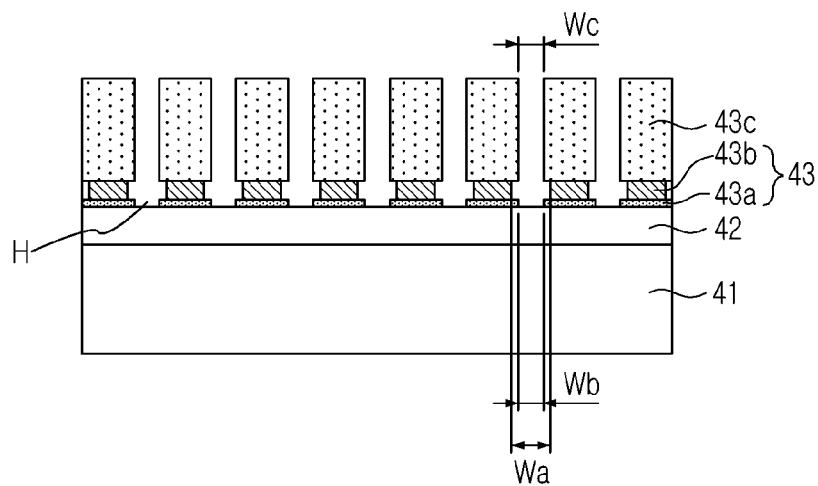
Figure 5C:
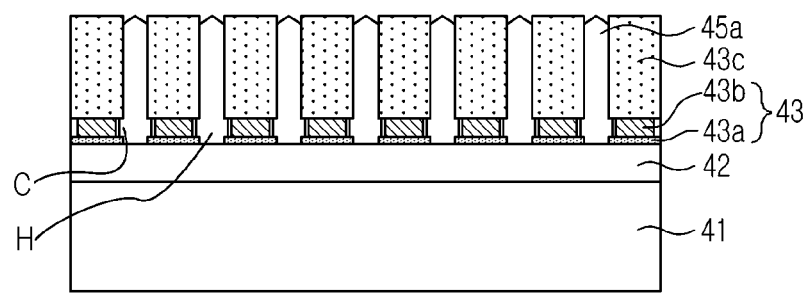

As illustrated in FIG. 5B, a plurality of openings H are formed in the mask 43 having the multi-layer structure. The plurality of openings H are formed in the first to third insulating layers 43a, 43b, 43c sequentially formed on the base layer 42 such that partial regions of the base layer 42 are exposed.

As mentioned above, in the etching conditions (primary editing conditions) for forming the plurality of openings, the second insulating layer 43b has an etching rate higher than those of the first and third insulating layers 43a, 43c, so the second insulating layer 43b is over etched during the process of forming the openings having a predetermined width to have the width Wb greater than the widths Wa and Wc of other regions. As a result, regions positioned in the second insulating layer 43b have openings H formed to have a sectional area larger than those of other upper and lower regions adjacent thereto. Here, the difference between the widths of the openings may be set in consideration of a degree to which the nanocores protrude and a thickness of the active layer.

For example, the first, second, and third insulating layers 43a, 43b, 43c may be implemented as SiN (high density), SiN (low density), and $SiO_2$, respectively, or may be implemented as SiN, $SiO_2$ (low density), and $SiO_2$ (high density), and in this case, a deep etching process using plasma reactive ion etching may be applied. During this etching process, desired overetching of the second insulating layer 43b may be accomplished due to the difference between the degrees of reactivity.

A size of the openings H may be designed in consideration of a size of a desired nano-light emitting structure. For example, the openings H may be formed to have a width equal to or smaller than 500 nm, preferably, equal to or smaller than 200 nm.

The openings H may be formed by using a semiconductor process and may be formed to have a high aspect ratio, for example. The aspect ratio of the openings H may be in the range of 5:1 to 10:1.

Thereafter, as illustrated in FIG. 5C, a first conductivity-type semiconductor is grown in the exposed regions of the base layer 42 to fill the plurality of openings H, forming the plurality of nanocores 45a.

During the process of growing the first conductivity-type semiconductor, over-growth takes place in the opening H2 regions corresponding to the second insulating layer 43b, making the nanocores 45a have the convex portion C.

The nitride single crystal constituting the nanocores 45a may be formed by using an MOCVD or MBE process, and the mask 43 may act as a mold for a nitride single crystal to provide the nanocores 45a corresponding to the shape of the openings. Namely, the nitride single crystal is selectively grown in the region of the base layer 42 exposed to the opening H by the mask 43, filling the opening H, and the nitride single crystal filling the opening H may have a shape corresponding to that of the opening H.

The first conductivity-type semiconductor of the nanocores 45a may be an n-type nitride semiconductor and may be a crystal satisfying an n-type $Al_xIn_yGa_{1-x-y}N$ ($0 \leq x \leq 1$, $0 \leq y \leq 1$, $0 \leq x+y \leq 1$), for example. The first conductivity-type semiconductor constituting the nanocores 45a may be the same material as the first conductivity-type semiconductor of the base layer 42. For example, the base layer 42 and the nanocores 45a may be formed of n-type GaN.

Figure 5D:
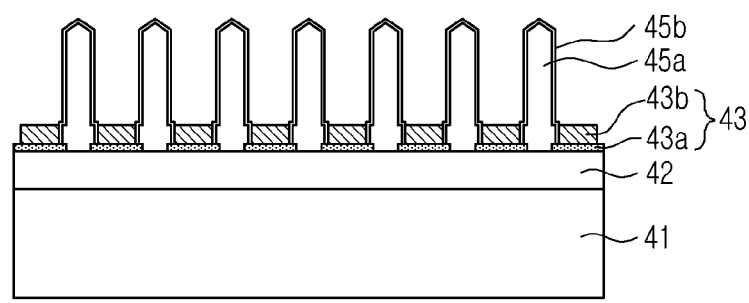

Thereafter, as illustrated in FIG. 5D, the mask 43 is partially removed by using the second insulating layer 43b as an etch stop layer such that lateral surfaces of the plurality of nanocores 45a are exposed, and the active layer 45b is subsequently grown on the surfaces of the nanocores 45a.

As discussed above, this etching process (secondary etching process) is performed under the conditions that the third insulating layer 43c is selectively removed, so the first and second insulating layers 43a and 43b remain. The second insulating layer 43b is employed as an etch stop layer during this etching process and may serve, together with the first insulating layer 43a, to prevent the second conductivity-type semiconductor layer 45c from being connected to the base layer 42 in a follow-up growth process.

In this manner, the third insulating layer 43c is selectively removed, and the active layer 45b is subsequently grown. During this process, the active layer 45b may be formed in a gap between the second insulating layer 43b and the opening, rather than being limited to the surfaces of the nanocores 45a corresponding to positions above the second insulating layer 43b. In this case, the gap for forming the active layer 45b on the side walls of the openings of the second insulating layer 43b may be obtained by regulating a degree of overetching during the primary etching process and a degree of overgrowing of the nanocores 45a.

After the mask 43 is partially removed, the nanocores 45a may be heat-treated before the active layer 45b is grown. Through the heat treatment process, the surfaces of the nanocores 45a are formed as stable crystal planes such as non-polar planes or anti-polar planes, enhancing quality of crystals grown in a follow-up process. This will be described later with reference to FIGS. 11A and 11B.

Figure 5E:
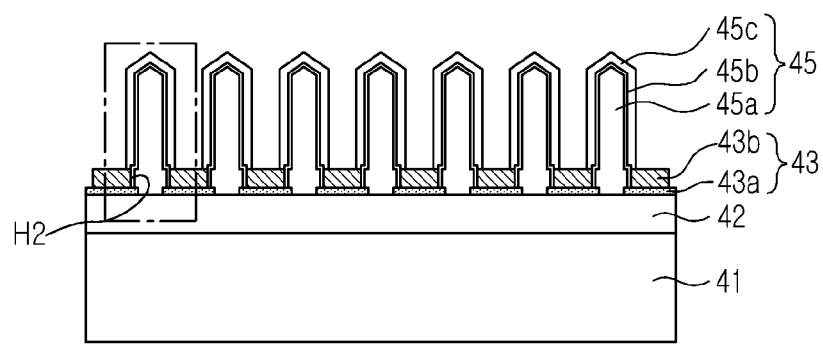

Subsequently, as illustrated in FIG. 5E, the second conductivity-type semiconductor layer 45c is grown on the surface of the active layer 45b by using the second insulating layer 43b. Through such a process, the nano-light emitting structure 45 may have a core-shell structure including the nanocore 45a formed of the first conductivity-type semiconductor and the shell layers including the active layer 45b and the second conductivity-type semiconductor layer 45c covering the nanocores 45a.

The second insulating layer 43b surrounds the active layer 45b formed on the surface of the plurality of nanocores 45a, and the second opening H2 of the second insulating layer 43b may be formed along the outer circumference of the active layer 45b. Also, the second conductivity-type semiconductor layer 45c is formed at a position above the second insulating layer 43b.

As a result, as described above with reference to FIG. 4, in detail, the active layer 45b is grown on the convex surface of the nanocore 45a above the exposed portion of the first insulating layer 43a, and as illustrated in FIG. 4, the active layer 45b may be formed such that an end thereof adjoins the surface of the first insulating layer 43a, and the active layer extends from the surface. Similarly, the second conductivity-type semiconductor layer 45c may be formed such that an end thereof may adjoin the surface of the second insulating layer 43b, and extends from the surface.

In the present embodiment, the active layer 45b may be provided as a single layer without the second conductivity-type semiconductor layer 45c on the surface of the nanocore 45a in the second opening of the second insulating layer 43b, and since a leakage current path extends by using the convex surface of the nanocore, the leakage current path can be lengthened to be greater than the thickness t of the second insulating layer 43b, significantly reducing a probability of generating a leakage current.

Figure 6:
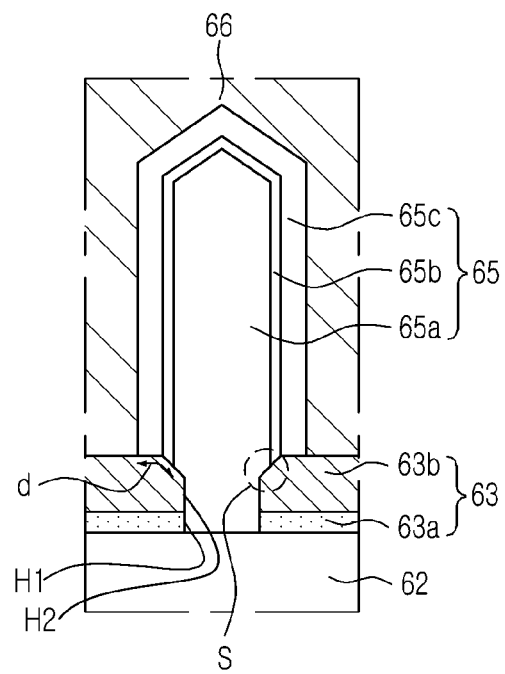
FIG. 6 is a cross-sectional view illustrating a nano-light emitting structure employed in another example according to an embodiment of the present disclosure.

In another embodiment of the present disclosure, an inner side wall of the second opening may have an upwardly sloped surface and an end of the active layer may be positioned on the sloped surface. FIG. 6 is a cross-sectional view illustrating a nano-light emitting structure employed in such an embodiment. Similar to the foregoing embodiment, a nano-light emitting structure 65 illustrated in FIG. 6 is formed on a base layer 62 formed of a first conductivity-type semiconductor, and includes a nanocore 65a formed of the first conductivity-type semiconductor and an active layer 65b and a second conductivity-type semiconductor layer 65c sequentially formed on the surface of the nanocore 65a.

The nano-light emitting structure 65 and the insulating layer structure illustrated in FIG. 6 may be understood as part of the nano-structure semiconductor light emitting device illustrated in FIG. 1. Description of the respective components with reference to FIG. 1 may be cited for reference as descriptions of the present embodiment unless otherwise specified.

Similarly to the foregoing embodiment, a first insulating layer 63a is formed on the base layer 62. The first insulating layer 63a has a plurality of first openings H1 exposing partial regions of the base layer 62. The second insulating layer 63b is formed on the first insulating layer 63a. The second insulating layer 63b has second openings H2 arranged in positions corresponding to the first openings H1. In this manner, the first and second insulating layers 63a and 63b may be provided as a single mask. The first and second insulating layers 63a and 63b may be formed of an insulator that may be used during a semiconductor process. For example, the insulator may be an insulating material such as $SiO_2$ or $SiN_x$.

As illustrated in FIG. 6, unlike the first opening H1, the second opening H2 has a sloped surface S formed to be sloped upwardly, and an upper end portion of the second opening H2 has a width greater than that of the first opening H1.

The exposed regions of the base layer 62 are provided by the first openings H1, and the nanocores 65a formed of the first conductivity-type semiconductor are formed in the exposed regions. An end of the active layer 65b may be positioned on the sloped surface S of the second insulating layer 63b so as to be formed at a position higher than the first insulating layer 63a. The second insulating layer 63b may surround a portion of the active layer 65b formed on the surface of the plurality of nanocores 65a.

Also, the second conductivity-type semiconductor layer 65c is formed on the surface of the active layer 65b positioned above the second insulating layer 63b. Due to the position of the shells (the active layer and the second conductivity-type semiconductor layer), a leakage current path may also be changed.

In detail, an end of the active layer 65b is positioned on the sloped surface S of the second insulating layer 63b and the second conductivity-type semiconductor layer 65c may be formed such that an end thereof adjoins a surface of the second insulating layer 63b, and extends from the surface of the second insulating layer. Accordingly, a leakage current path d is lengthened to be as long as the active layer 65b, reducing a probability of generating a leakage current.

Figure 7A:
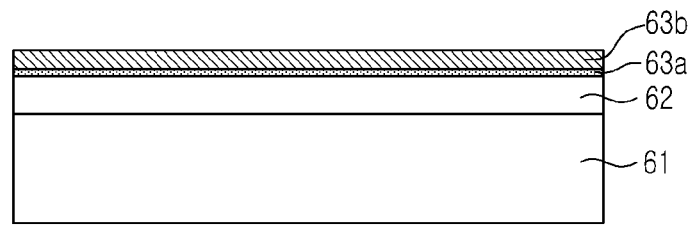
FIGS. 7A through 7C are cross-sectional views illustrating major processes of a method for manufacturing a light emitting device employing the nano-light emitting structure in FIG. 6.
Figure 7B:
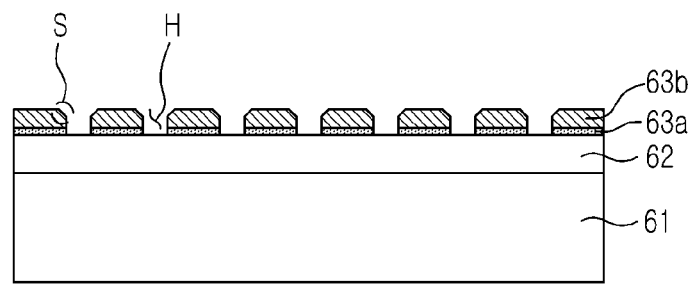
Figure 7C:
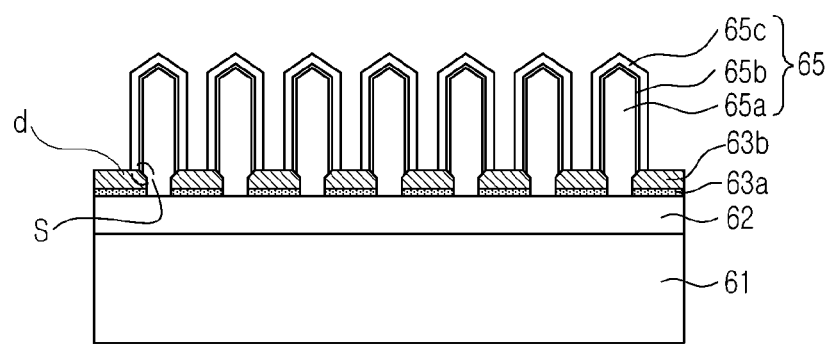

Such a nano-light emitting structure can be easily implemented through a method for manufacturing multiple insulating layers having different etching rates as a mask. FIGS. 7A through 7C are cross-sectional views illustrating major processes of a method for manufacturing the semiconductor light emitting device of FIG. 4 using a dual-layer mask.

As illustrated in FIG. 7A, the base layer 62 is formed on a substrate 61, and a mask 63 having a dual-layer structure is formed on the base layer 62.

The mask 63 employed in the present embodiment includes first and second insulating layers 63a and 63b sequentially formed on the base layer 62. The first and second insulating layers 63a and 63b may be made of materials having electrical insulating properties.

The first and second insulating layers 63a and 63b may be selected to meet the requirements that the second insulating layer 63b has an etching rate higher than that of the first insulating layer 63a during an etching process to form openings.

The difference in etching rates may be implemented by using different materials or different and different density (air gap density) of materials. For example, the first and second insulating layers 63a, 63b may be made of different materials in order to induce a desired difference in etching rates. The first insulating layer 63a may be made of SiN and the second insulating layer 63b may be made of $SiO_2$. Alternatively, a difference in etching rates may be implemented by using materials with different air gap densities. In this case, the first and second insulating layers 63a and 63b may be made of materials having different air gap densities.

As illustrated in FIG. 7B, a plurality of openings H are formed in the mask 63 having a dual-layer structure. A plurality of openings H are formed in the first and second insulating layers 63a and 63b sequentially formed in the base layer 62 such that partial regions of the base layer 62 are exposed.

As mentioned above, in the etching conditions for forming the plurality of openings, the second insulating layer 63b has an etching rate higher than that of the first insulating layer, so the second insulating layer 63b is over etched to have an upwardly sloped surface.

In this case, desired overetching of the second insulating layer 63b can be accomplished by a difference in degrees of reactivity by using an etching process such as a plasma reactive ion etching process.

A size of the openings H may be designed in consideration of a size of a desired nano-light emitting structure. For example, the openings H may be formed to have a width equal to or smaller than 500 nm, preferably, equal to or smaller than 200 nm.

Thereafter, as illustrated in FIG. 7C, a first conductivity-type semiconductor is grown in the exposed regions of the base layer 62 by using the mask 63 to form a plurality of nanocores 65a, and the active layer 65b and the second conductivity-type semiconductor layer 65c are sequentially grown on the surface of the nanocores 65a.

Such a process may be implemented by using an MOCVD or MBE process in case of employing a nitride single crystal. Through this process, the nanocores 65a formed of the first conductivity-type semiconductor are formed in the exposed regions and the active layer 65b may be formed such that an end thereof is positioned on the sloped surface S of the second insulating layer 63b, so as to be positioned above the first insulating layer 63a. The second insulating layer 63b may surround a portion of the active layer 65b formed on the surfaces of the plurality of nanocores 65a.

In detail, an end of the active layer 65b is positioned on the sloped surface S of the second insulating layer 63b, and an end of the second conductivity-type semiconductor layer 65c may be formed adjoining the surface of the second insulating layer 63b. Accordingly, the leakage current path d is lengthened to be as long as the active layer positioned on the sloped surface S, reducing leakage current generation probability.

Figure 8A:
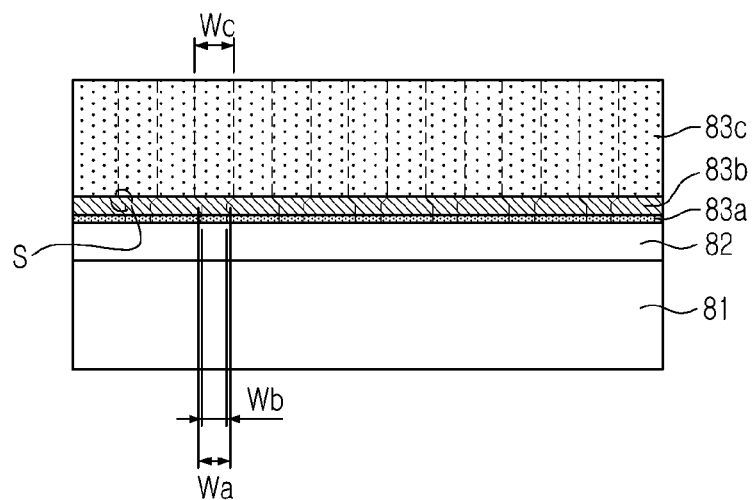
FIGS. 8A and 8B are cross-sectional views illustrating processes using a different multi-layer mask for obtaining the nano-light emitting structure in FIG. 7C.
Figure 8B:
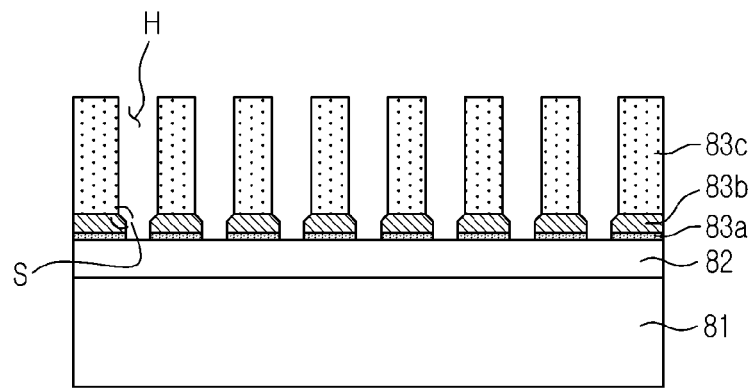

A similar mask structure may be implemented through a manufacturing method using a mold. FIGS. 8A and 8B are cross-sectional views illustrating processes using a tri-layer mask (mold) for obtaining the nano-light emitting structure in FIG. 7C.

As illustrated in FIG. 8A, a base layer 82 is provided on a substrate 81, and a mask 83 having a multi-layer structure is formed on the base layer 82.

The mask 83 employed in the present embodiment includes first to third insulating layers 83a, 83b, 83c sequentially formed on the base layer 82. The first and second insulating layers 83a, 83b are made of a material having electrical insulating properties, and the third insulating layer 83c may also be made of an insulating material as necessary.

The first to third insulating layers 83a, 83b, 83c employed in the present embodiment are selected to satisfy conditions that etching rates are higher in order of the first insulating layer 83a, the second insulating layer 83b, and the third insulating layer 83c during a first etching process and the third insulating layer 83c has an etching rate as low as to be selectively removed during a second etching process. The first etching process may be a process of forming openings, during which a sloped surface is introduced to the second insulating layer 83b, and the second etching process may be a process of partially removing a mold such that a surface of the nano-light emitting structure is exposed.

The difference in etching rates may be implemented by using at least one of a type and density (air gap density) of a material. For example, the first to third insulating layers 83a, 83b, 83c may be implemented as SiN—$SiO_2$ (low density)-$SiO_2$ (high density), respectively. Here, high density may refer to a state in which there is a very small air gap, or a relatively low air gap density, and low density may refer to a relatively high air gap density.

A total thickness of the first to third insulating layers 83a, 83b, 83c may be designed in consideration of a height of a desired nano-light emitting structure. The first and second insulating layers 83a and 83b may have a thickness smaller than that of the third insulating layer 83c. An etch stop level of the second insulating layer 83b may be as high as one-third of the overall height of the mask 83 from the surface of the base layer 82, i.e., a total thickness of the first to third insulating layers 83a, 83b, 83c.

As illustrated in FIG. 8B, a plurality of openings H are formed in the mask 83 having the triple-layer structure. The plurality of openings H are formed in the first to third insulating layers 83a, 83b, 83c sequentially formed on the base layer 82 such that partial regions of the base layer 82 are exposed.

As mentioned above, in the etching conditions (primary editing conditions) for forming the plurality of openings, the first to third insulating layers 83a, 83b, 83c have etching rates which are sequentially low. Thus, as illustrated, an opening width of the third insulating layer 83c is greater than that of the first insulating layer 83a, and the second insulating layer 83b has a sloped surface sloped upwardly.

For example, as mentioned above, the mask 83 may be implemented as SiN—SiO$_2$ (low density)-SiO$_2$ (high density), respectively, and in this case, a deep etching process using plasma reactive ion etching may be applied. By using appropriate differences in reactive etching conditions and degrees of density, a profile of openings different from those of FIG. 5B can be obtained. The triple-layer mask 83 used as a mold may also be used to obtain the nano-light emitting structure illustrated in FIG. 6.

In the foregoing embodiment, a method for improving a leakage current path from the second conductivity-type semiconductor layer to the nanocores is proposed. A leakage current path from the metal electrode (contact electrode) to the nanocores may also affect the leakage current characteristics. In this case, the second conductivity-type semiconductor layer having a level of conductivity lower than that of metal, in addition to the active layer, should also be taken into account, over the leakage current path.

Hereinafter, a method for extending a leakage current path from the contact electrode to the nanocores according to another embodiment of the present disclosure will be described.

Figure 9:
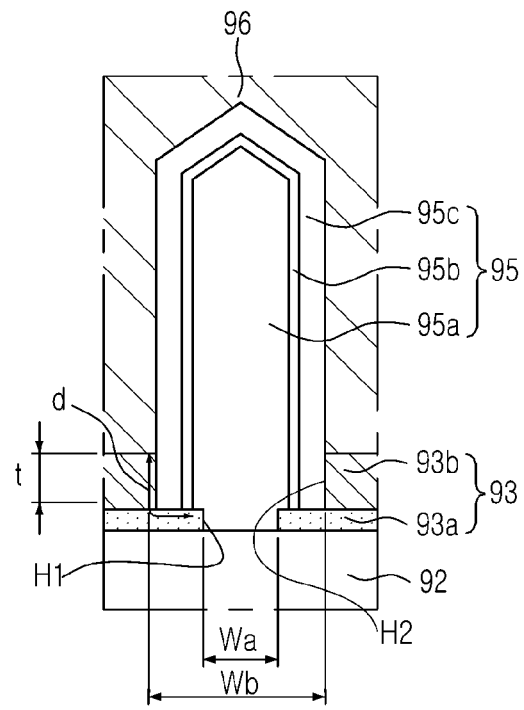
FIG. 9 is a cross-sectional view illustrating a nano-light emitting structure employed in another embodiment of the present disclosure.

FIG. 9 is a cross-sectional view illustrating a nano-light emitting structure employed in another embodiment of the present disclosure.

The nano-light emitting structure 95 illustrated in FIG. 9 is formed on a base layer 92 formed of a first conductivity-type semiconductor, and includes a nanocore 95a formed of the first conductivity-type semiconductor and an active layer 95b and a second conductivity-type semiconductor layer 95c sequentially formed on the surface of the nanocore 95a.

The nano-light emitting structure 95 and the insulating layer structure illustrated in FIG. 9 may be understood as part of the nano-structure semiconductor light emitting device illustrated in FIG. 1. Descriptions of the respective components with reference to FIG. 1 may be cited for reference as descriptions of the present embodiment unless otherwise specified.

Similar to the embodiment illustrated in FIG. 1, in the present embodiment, a first insulating layer 93a is formed on the base layer 92. The first insulating layer 93a has a plurality of first openings H1 exposing partial regions of the base layer 92. The second insulating layer 93b is formed on the first insulating layer 93a. The second insulating layer 93b has second openings H2 arranged in positions corresponding to the first openings H1. In this manner, the first and second insulating layers 93a and 93b may be provided as a single mask. The first and second insulating layers 93a and 93b may be formed of an insulator that may be used during a semiconductor process. For example, the insulator may be an insulating material such as SiO$_2$ or SiN$_x$.

As illustrated in FIG. 9, the width Wb of the second opening H2 is greater than the width Wa of the first opening H1, and a portion of the first insulating layer 93a may be exposed along the perimeter of the first opening H1 by the second opening H2. The exposed regions of the base layer 92 are provided by the first openings H1, and the nanocores 95a formed of the first conductivity-type semiconductor is formed in the exposed regions and the active layer 95b and the second conductivity-type semiconductor layer 95c are sequentially formed on the surfaces of the nanocores 95a.

The nanocores 95a are formed on the surface of the base layer 92, but the active layer 95b and the second conductivity-type semiconductor layer 95c may be formed at positions above the first insulating layer 93a. The second insulating layer 93b surrounds the active layer 95b and the second conductivity-type semiconductor layer 95c formed on the surfaces of the plurality of nanocores 95a, and the second opening H2 of the second insulating layer 93b is formed along the perimeter of the nano-light emitting structure 95.

Meanwhile, a contact electrode 96 electrically connected to the second conductivity-type semiconductor layer 95c is formed on the surface of the second conductivity-type semiconductor layer 95c positioned above the second insulating layer 93b.

With such a structure, a leakage current path between the contact electrode 96 and the nanocores 95a may be lengthened. In detail, a path d extending as long as the extended portion of the second conductivity-type semiconductor layer 95c (equal to the thickness of the second insulating layer 93b) which corresponds to the opening of the second insulating layer 93b and is not in direct contact with the contact electrode 96 and a thickness of the active layer 95b, is formed. Due to the lengthened path d, a probability of generating a leakage current can be significantly reduced. The nano-light emitting structure may be easily implemented by using the multiple insulating layers having different etching rates as a mask in the method for manufacturing the nano-structure semiconductor light emitting device using the mask as a mold. FIGS. 10A through 10F are cross-sectional views illustrating steps of a method for manufacturing a light emitting device employing the nano-light emitting structure in FIG. 9.

Figure 10A:
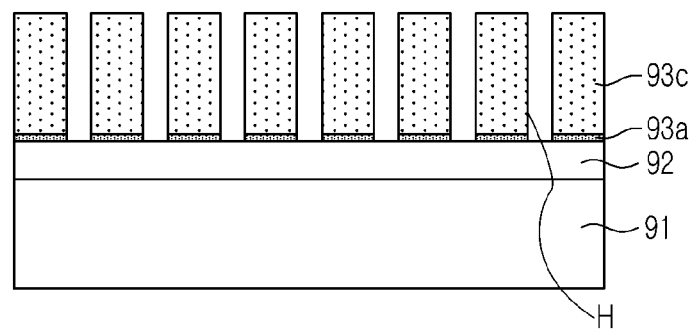
FIGS. 10A through 10F are cross-sectional views illustrating major processes of a method for manufacturing a light emitting device employing the nano-light emitting structure in FIG. 9.

As illustrated in FIG. 10A, the base layer 92 is provided on a substrate 91, and a mask 93 having a plurality of openings H is formed on the base layer 92.

The mask 93 employed in the present embodiment includes first and second insulating layers 93a and 93b sequentially formed on the base layer 92. The first and second insulating layer 93a, 93b may be made of a material having electrical insulating properties.

In particular etching conditions, the first insulating layer 93a may have an etching rate lower than that of the second insulating layer 93b, thereby serving as an etch stop layer. The difference in etching rates may be implemented by using materials and different density (air gap density) materials.

A total thickness of the first and second insulating layers 93a and 93b may be designed in consideration of a height of a desired nano-light emitting structure.

A plurality of openings H are formed in the first and second insulating layers 93a and 93b sequentially formed on the base layer 92 such that partial regions of the base layer 92 are exposed.

Thereafter, as illustrated in 10B, a first conductivity-type semiconductor is grown in exposed regions of the base layer 92 such that the plurality of openings H are filled, forming a plurality of nanocores 95a.

The first conductivity-type semiconductor of the nanocores 95a may be n-type nitride semiconductor satisfying n-type Al$_x$In$_y$Ga$_{1-x-y}$N (0≤x≤1, 0≤y≤1, 0≤x+y≤1), for example. The first conductivity-type semiconductor constituting the nanocores 95a may be the same material as the first conductivity-type semiconductor of the base layer 92. For example, the base layer 92 and the nanocores 95a may be made of n-type GaN.

The nitride single crystal constituting the nanocores 95a may be formed by using an MOCVD or MBE process, and the mask 93 may act as a mold for a nitride single crystal to provide the nanocores 95a corresponding to the shape of the openings. Namely, the nitride single crystal is selectively grown in the region of the base layer 92 exposed to the opening H by the mask 93, filling the opening H, and the nitride single crystal filling the opening H may have a shape corresponding to that of the opening H.

Figure 10B:
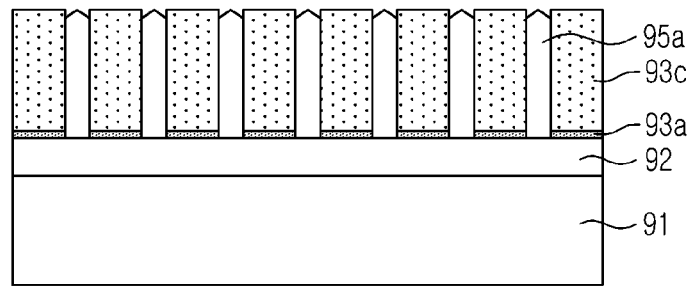
Figure 10C:
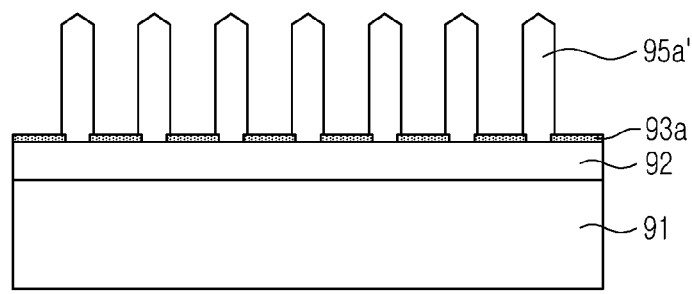

Thereafter, as illustrated in FIG. 10C, the mask 93 is partially removed by using the etch stop layer such that lateral surfaces of the plurality of nanocores 95a are exposed, and a heat treatment process is applied thereto.

In the present embodiment, an etching process is performed under the conditions that only the second insulating layer 93b is selectively removed while leaving the first insulating layer 93a. The first insulating layer 93a is employed as an etch stop layer during this etching process and may serve to prevent the active layer 95b and the second conductivity-type semiconductor layer 95c from being connected to the base layer 92 in a follow-up growth process.

In the present embodiment, an additional heat treatment process may be introduced to enhance crystallinity during a process of manufacturing the nano-light emitting structure using the mask having the openings as a mold. Nanocores 95a' having improved surface crystallinity after being heat-treated are illustrated in FIG. 10C.

After the mask 95 is partially removed, the surfaces of the nanocores 95a are heat-treated under predetermined conditions to change crystal planes of the nanocores 95a into stable faces advantageous for crystal growth like an anti-polar or non-polar crystal plane. This heat treatment process will be described with reference to FIGS. 11A and 11B.

Figure 11A:
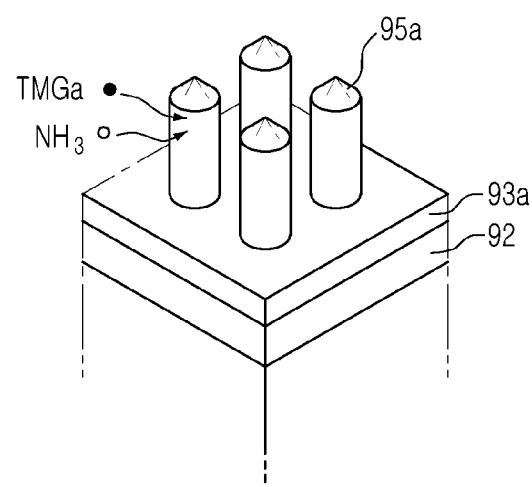
FIGS. 11A and 11B are schematic views illustrating a thermal annealing process employed in FIG. 10C.
Figure 11B:
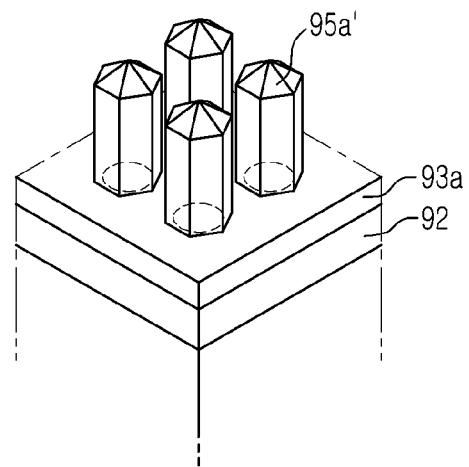

FIGS. 11A and 11B are schematic views illustrating a heat treatment process (or an annealing process) employed in FIG. 10C.

FIG. 11A illustrates the nanocores 95a obtained in FIG. 10B. The nanocores 95a have crystal planes determined according to a shape of openings. Although varied according to a shape of openings, surfaces of the nanocores 95a so obtained generally have relatively unstable crystal planes, which is not advantageous for a follow-up crystal growth.

In the present embodiment, when openings have a cylindrical rod shape, lateral surfaces of the nanocores have a curved surface, rather than a particular crystal plane.

When the nanocores are heat-treated, the unstable crystals on surfaces thereof are rearranged to have stable crystal planes such as anti-polar or non-polar planes as illustrated in FIG. 11B. The heat treatment is performed at a temperature of at least 800° C. for a few minutes to tens of minutes to change unstable crystal planes into desired stable crystal planes.

For example, when grown by using a C-plane (0001) of a sapphire substrate, the nanocores illustrated in FIG. 6A may be heat-treated at a temperature equal to or higher than 800° C. to change an unstable curved face into non-polar planes (m planes). The process of stabilizing the crystal planes may be implemented through a heat treatment process at a high temperature. It is difficult to clearly explain this principle but it may be understood that crystals positioned on a surface are re-arranged at a high temperature or when a source gas remains within a chamber, partial re-growth is performed to allow the residual source gas to be deposited to have stable crystal planes.

In particular, in the case of re-growth, a heat treatment process is performed under an atmosphere in which a source gas remains within a chamber, or a heat treatment may be performed under conditions, wherein a small amount of source gas is supplied. For example, as illustrated in FIG. 11A, in the case of an MOCVD chamber, TMGa and $NH_3$ remain and a heat treatment is performed under the residual atmosphere to allow the source gas to react to the surface of the nanocores to make partial re-growth to have stable crystal planes, and due to the re-growth, a size of the heat-treated nanocores 95a' may be slightly increased as shown in FIG. 11B.

In this manner, the heat treatment process may be performed under conditions similar to core formation conditions within the MOCVD chamber after the mask is removed, enhancing surface qualities of the nano-structures. That is, through the heat treatment process, non-uniformity (e.g., defects, or the like) on the surface of a core manufactured after the mask is removed can be eliminated and a shape of the core can be controlled to have a stable structure, for example, a hexagonal pillar form. In this case, the heat treatment process may be performed under a temperature condition similar to the condition for growing the cores, for example, 800° C. to 1200° C.

Figure 10D:
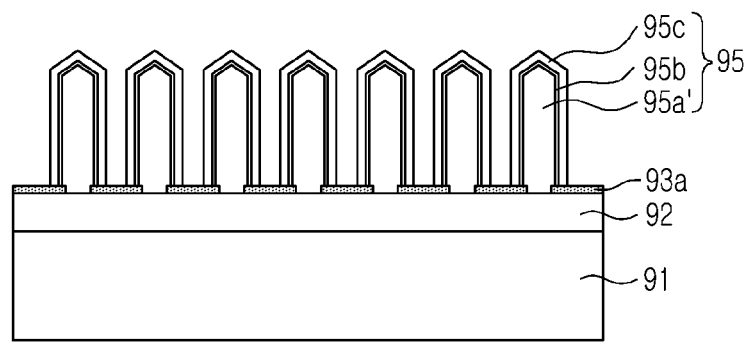

Thereafter, as illustrated in FIG. 10D, the active layer 95b and the second conductivity-type semiconductor layer 95c are sequentially grown on the surfaces of the plurality of nanocores 95a'. Through this process, the nano-light emitting structure 95 may have the core-shell structure including the nanocores 95a formed of the first conductivity-type semiconductor and the shell layers made up of the active layer 95b and the second conductivity-type semiconductor layer 95c covering the nanocores 95a.

The active layer 95b may have a multi-quantum well (MQW) structure in which a quantum well layer and a quantum barrier layer are alternately laminated. For example, in the case of a nitride semiconductor, a GaN/InGaN structure may be used, or a single quantum well (SQW) structure may also be used, as necessary.

The second conductivity-type semiconductor layer 95c may be a p-type $Al_xIn_yGa_{1-x-y}N$ crystal. The second conductivity-type semiconductor layer 95c may further include an electron blocking layer (not shown) in a region adjacent to the active layer 95b. The electron blocking layer (not shown) may have a structure in which a plurality of n-type $In_xAl_yGa_{(1-x-y)}N$ layers having different compositions are laminated or may have one or more layers including $Al_yGa_{(1-y)}N$. The electron blocking layer has a bandgap wider than that of the active layer 95b, thus preventing electrons from being transferred to the second conductivity-type (p-type) semiconductor layer 95c.

Figure 10E:
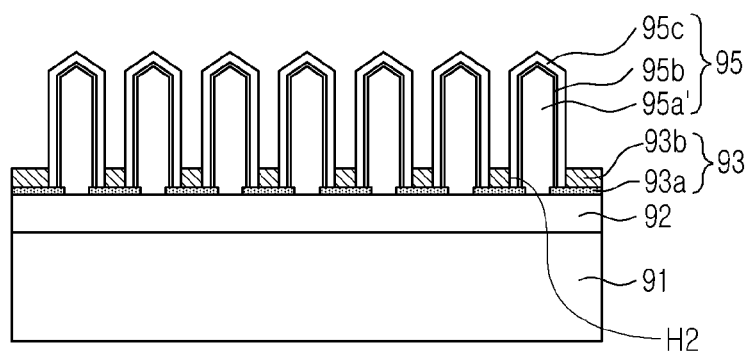

Thereafter, as illustrated in FIG. 10E, a secondary mask 93b is formed on the first insulating layer 93a. The second mask 93b may be made of an insulating material such as $SiO_2$ or SiN. In the present embodiment, the second mask 93b may be made of the same material as that of the first insulating layer 93b. Since the second openings H2 are provided after the second conductivity-type semiconductor layer 95c is formed, the second openings H2 may be formed to surround the nano-light emitting structures 95. In other words, the second conductivity-type semiconductor layer 95c may be formed on inner side walls of the second openings H2 corresponding to a thickness of the second mask 95b.

Figure 10F:
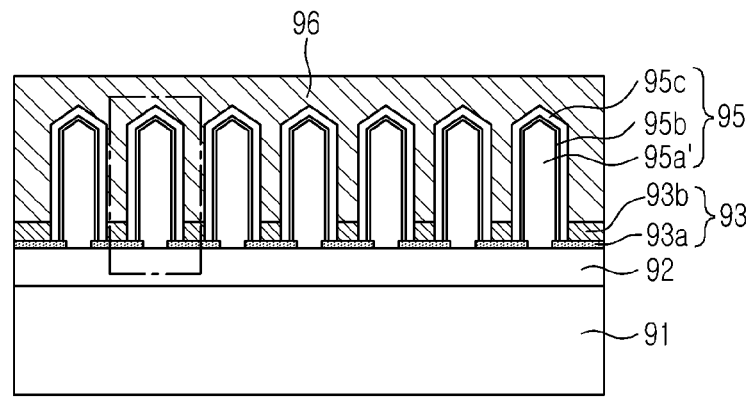

Thereafter, as illustrated in FIG. 10F, the contact electrode 96 is formed on the surface of the second conductivity-type semiconductor layer 95c.

The contact electrode 96 may be obtained by forming a seed layer (not shown) on the surface of the nano-light emitting structures 95 and subsequently performing electroplating thereon. The seed layer (not shown) may be made of a material appropriate for actualizing ohmic-contact with the second conductivity-type semiconductor layer.

In such a structure, a leakage current path between the contact electrode 96 and the nanocores 96a has a path extending as long as the extended portion of the second conductivity-type semiconductor layer 95c (equal to the thickness of the second insulating layer 93b) which corresponds to the opening of the second insulating layer 93b and is not in direct contact with the contact electrode 96 and a thickness of the active layer 95b. Due to the lengthened path of the leakage current, a probability of generating a leakage current can be significantly reduced.

If necessary, after the contact electrode 96 is formed, a polishing process may be performed to smooth the contact electrode 96 upper surface.

In the present embodiment, the contact electrode 96 comprises a reflective metal layer and light is extracted in a direction toward the substrate, but the present disclosure is not limited thereto and the contact electrode 96 may be made of a transparent electrode material such as ITO to allow light to be extracted in a direction toward the nano-light emitting structures 95.

In the present embodiment, the contact electrode 96 may fill spaces between the nano-light emitting structures 95, without being limited thereto. The contact electrode may be formed as a thin layer on the surface of the nano-light emitting structures 95 and a filler material having electrical insulating properties and may fill the spaces between the nano-light emitting structures 95.

In the foregoing embodiment, the second insulating layer 93b may be provided by performing a surface oxidation process on the first insulating layer 93a, rather than forming the first insulating layer 93a through an additional deposition process. This embodiment is illustrated in FIG. 12.

Figure 12:
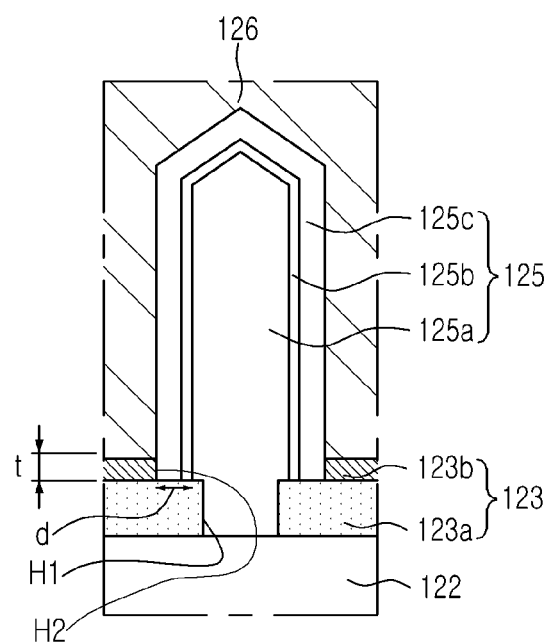
FIG. 12 is a cross-sectional view illustrating a nano-light emitting structure employed in another embodiment of the present disclosure.

A nano-light emitting structure 125 illustrated in FIG. 12 is formed on a base layer 122 comprising a first conductivity-type semiconductor and including a nanocore 125a comprising a first conductivity-type semiconductor, an active layer 125b, and a second conductivity-type semiconductor layer 125c sequentially formed on the surface of the nanocore 125a.

The nano-light emitting structure 125 and insulating layer structure is similar to the embodiment illustrated in FIG. 9. A first insulating layer 123a is disposed on the base layer 122. The first insulating layer 123a has a plurality of first openings H1 exposing partial regions of the base layer 122. The second insulating layer 123b is formed on the first insulating layer 123a. The second insulating layer 123b has second openings H2 arranged in positions corresponding to the first openings H1. In this manner, the first and second insulating layers 123a, 123b may form a single mask.

In the present embodiment, the second insulating layer 123b may be obtained by oxidizing the surface of the first insulating layer 123a. For example, in a case in which the first insulating layer 123a may be $SiN_x$ and the second insulating layer 123b may be an oxynitride, such as SiON.

As illustrated in FIG. 12, the active layer 125b and the second conductivity-type semiconductor layer 125c may be formed at positions above the first insulating layer 123a. The second insulating layer 123b surrounds the active layer 125b, the second conductivity-type semiconductor layer 125c is formed on the surfaces of the plurality of nanocores 125a, and the second opening H2 of the second insulating layer 123b is formed along the perimeter of the nano-light emitting structure 125.

Meanwhile, a contact electrode 126 electrically connected to the second conductivity-type semiconductor layer 125c is formed on the surface of the second conductivity-type semiconductor layer 125c positioned above the second insulating layer 123b. With such a structure, a leakage current path between the contact electrode 126 and the nanocores 125a may be changed. In particular, a path d extending as long as the extended portion of the second conductivity-type semiconductor layer 125c (equal to the thickness of the second insulating layer 123b) which corresponds to the opening of the second insulating layer 123b and is not in direct contact with the contact electrode 126 and a thickness of the active layer 125b, is formed. Due to the lengthened path d, a probability of generating a leakage current can be significantly reduced.

In the case of the nano-light emitting structure employed in the present embodiment, a lateral surface thereof is illustrated as being perpendicular to the surface of the base layer, but the present disclosure is not limited thereto and the nano-light emitting structure may have a lateral surface having a predetermined tilt angle. The sloped lateral surface may be advantageous for extracting light from the nano-light emitting structure.

The nano-light emitting structure having the sloped lateral surface may be manufactured in various manners. For example, in a method using a mask as a mold structure, the mask having an opening with an appropriate sloped surface may be provided to provide a nanocore having a sloped lateral surface corresponding to the shape of the opening, and an active layer and a second conductivity-type semiconductor layer may be grown to have a predetermined thickness, thus providing a nano-light emitting structure having a desired sloped lateral surface.

As set forth above, according to embodiments of the invention, since a path causing a leakage current in the interface with the mask is lengthened by using the active layer or the first conductivity-type semiconductor layer corresponding to a shell, the generation of a leakage current can be considerably suppressed.

The structure of lengthening the leakage current path can be more easily implemented by using a multi-layer mask utilized as a mold.

The foregoing technical solutions do not fully enumerate all of the features of the present inventive concept. The foregoing and other objects, features, aspects and advantages of the present inventive concept will become more apparent from the following detailed description of the present disclosure when taken in conjunction with the accompanying drawings.

While the present inventive concept has been shown and described in connection with the embodiments, it will be apparent to those skilled in the art that modifications and variations can be made without departing from the spirit and scope of the invention as defined by the appended claims.

What is claimed is:

1. A nano-structure semiconductor light emitting device comprising:
   a base layer formed of a first conductivity type semiconductor;
   a first insulating layer disposed on the base layer and having a plurality of first openings exposing partial regions of the base layer;
   a plurality of nano-light emitting structures, each comprising a nanocore disposed in the exposed regions of the base layer and formed of the first conductivity-type semiconductor and a shell including an active layer and a second conductivity-type semiconductor layer sequentially disposed on a surface of the nanocore; and
   a second insulating layer disposed on the first insulating layer and having a plurality of second openings surrounding the nanocore and the active layer,
   wherein the second openings have a diameter greater than that of the first openings, and a portion of the first insulating layer in a perimeter of the first openings is exposed by the second openings;

wherein the active layer is entirely positioned above the exposed portion of first insulating layer and the second conductivity-type semiconductor layer is entirely positioned above the second insulating layer.

2. The nano-structure semiconductor light emitting device of claim 1, wherein regions of the nanocores positioned in the second openings have a sectional area greater than upper and lower regions thereof.

3. The nano-structure semiconductor light emitting device of claim 1, wherein the first and second insulating layers are made of a same material.

4. The nano-structure semiconductor light emitting device of claim 1, wherein the first and second insulating layers have different etching rates under same etching conditions.

5. The nano-structure semiconductor light emitting device of claim 4, wherein an etching rate of the second insulating layer is higher than that of the first insulating layer.

6. The nano-structure semiconductor light emitting device of claim 4, wherein the first and second insulating layers are made of different materials or have different air gap densities.

7. The nano-structure semiconductor light emitting device of claim 1, wherein
the second insulating layer is made of a material obtained by oxidizing a material of the first insulating layer.

* * * * *